United States Patent
Masterson

(10) Patent No.: US 6,602,793 B1
(45) Date of Patent: Aug. 5, 2003

(54) PRE-CLEAN CHAMBER

(75) Inventor: Sean Masterson, Costa Mesa, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 09/497,360

(22) Filed: Feb. 3, 2000

(51) Int. Cl.$^7$ .............................................. H01L 21/00
(52) U.S. Cl. ................ 438/706; 438/8; 438/9; 438/498; 438/504; 438/698; 438/704; 438/905; 438/906; 134/1.1; 315/111.21; 213/57; 213/58; 156/345
(58) Field of Search ...................... 438/905–908, 438/698–714, 8–9, 33, 113, 444, 498–504; 134/1.1; 315/111.21; 213/37, 57–58, 67; 156/345

(56) References Cited

U.S. PATENT DOCUMENTS

| | | | | |
|---|---|---|---|---|
| 5,111,622 A | * | 5/1992 | Steere, Jr. ........................ 51/5 |
| 5,224,841 A | * | 7/1993 | Thompson et al. ......... 417/392 |
| 5,292,399 A | * | 3/1994 | Lee et al. .................... 156/643 |
| 5,578,164 A | * | 11/1996 | Kurono et al. ........... 156/643.1 |
| 5,653,808 A | * | 8/1997 | MacLeish et al. .......... 118/715 |
| 5,685,941 A | * | 11/1997 | Forster et al. .............. 156/345 |
| 5,779,803 A | * | 7/1998 | Kurono et al. .............. 118/723 |
| 5,863,397 A | * | 1/1999 | Tu et al. ...................... 204/298 |
| 5,939,831 A | * | 8/1999 | Fong et al. ............. 315/111.21 |
| 6,071,184 A | * | 6/2000 | Anderson, III .............. 451/398 |
| 6,095,193 A | * | 8/2000 | Kanzaka et al. ......... 137/637.2 |
| 6,102,164 A | * | 8/2000 | McClintock et al. ....... 187/267 |
| 6,107,192 A | * | 8/2000 | Subrahmanyan et al. ... 438/637 |
| 6,508,199 B1 | * | 8/2000 | Oyabu ......................... 118/723 |
| 6,114,216 A | * | 9/2000 | Yieh et al. ................... 438/424 |
| 6,125,788 A | * | 10/2000 | Hills et al. .................. 118/723 |
| 6,132,564 A | * | 10/2000 | Licata .................... 204/192.15 |
| 6,156,151 A | * | 12/2000 | Komino et al. ............. 156/345 |
| 6,190,037 B1 | * | 2/2001 | Das et al. .................... 374/121 |
| 6,190,495 B1 | * | 2/2001 | Kubota et al. .............. 156/345 |
| 6,398,873 B1 | * | 6/2002 | Yum ........................... 118/725 |
| 2001/0035132 A1 | * | 11/2001 | Kent et al. ................... 118/753 |
| 2002/0106894 A1 | * | 8/2002 | Yum ........................... 438/665 |

OTHER PUBLICATIONS

Applied Materials, "Endura® PVD Functional Description," Oct. 1993, pp. 1–1 to 1–28.

* cited by examiner

Primary Examiner—Matthew Smith
Assistant Examiner—Granvill D Lee
(74) Attorney, Agent, or Firm—Farjami & Farjami LLP

(57) ABSTRACT

An improved pre-clean chamber of a semiconductor processing system minimizes the generation of particulates during processing, thereby decreasing contamination levels that can adversely affect plasma vapor deposition film properties while also decreasing operational costs. The pre-clean chamber comprises an insulator collar that insulates the outside diameter surface of a wafer pedestal, thereby mitigating the etching of the wafer pedestal during etching. The pre-clean chamber further comprises a gas trench cover that directs a suitable etching gas from a gas inlet trench into streams that are focused up and towards the center of the chamber to reduce the extent to which gas bombards the chamber cover. The pre-clean chamber also comprises a bellows cover which protects the bellows of a wafer lift during etching, further reducing the dislodgment of particulates during etching.

31 Claims, 5 Drawing Sheets

PRE-CLEAN CHAMBER

FIELD OF INVENTION

The present invention relates to a new and improved pre-clean chamber for use in high vacuum sputtering systems for the deposition and/or etching of material on a wafer in the manufacture of integrated circuits.

BACKGROUND OF THE INVENTION

High vacuum sputtering systems for the deposition and/or etching of material on a wafer in the manufacture of integrated circuits are well known. In particular, plasma vapor deposition ("PVD") is used to deposit thin metal films for interconnect metalization on semiconductor wafers. PVD systems are typically automated systems that employ a plurality of processing chambers. Known PVD systems typically comprise a first air lock loading chamber in which cassettes containing a plurality of wafers to be processed are placed and from which the wafers are transported to a second vacuum chamber (or transportation chamber) by any suitable conveyor. Subsequently, the wafers are placed on a rotating table or stage in the plasma vapor deposition chamber. After the deposition process, the processed wafers are again transported back through the transportation chamber, to the loading chamber, and then back into the cassette for further handling/processing.

Prior to the PVD process, the wafers undergo a pre-clean process in a pre-clean chamber to remove any chemical residue or oxide which maybe formed when the wafer is exposed to atmosphere. Any chemical residue or oxide which remains on the wafer can act as a dielectric shield and impede the PVD film from uniformly adhering to the surface. The pre-clean chamber applies a light, non-selective, non-reactive plasma etch to the wafer to remove chemical residue remaining on the wafer surface. It also removes the thin layer (20–150 angstroms) of oxide which is formed when the wafer is exposed to atmosphere.

FIG. 1 illustrates a pre-clean chamber of the prior art. A chamber 100 comprises a base 102 and a chamber wall 104 that includes a wafer port (not shown) for receiving a wafer W in chamber 100. Once introduced into chamber 100 from the transport chamber (not shown) under vacuum, wafer W is transferred to a wafer lift 106, which is comprised of a wafer pedestal 108, an insulator 110, an insulator base 118, a shaft 120 and a bellows assembly 112. Wafer W is seated upon wafer pedestal 108 comprising an RF-biased, disk-shaped platform made from aluminum, titanium or other non-reactive metal. Wafer pedestal 108 is supported and insulated by insulator 110. Insulator 110 is generally a one-piece insulator, preferably comprising a non-reactive insulative material such as ceramic or quartz. Insulator 110 insulates the sides and bottom of wafer pedestal 108 and collimates the RF power to the top surface of wafer pedestal 108 and, hence, through wafer W. Insulator 110 is supported by insulator base 118. Shaft 120 supports wafer pedestal 108, insulator 110 and insulator base 118 and moves wafer W vertically between a release position, where wafer W is introduced from and is removed to the transport chamber, and a processing position, where wafer W is maintained during the etching process. Bellows assembly 112 surrounds shaft 120 and isolates shaft 120 when chamber 100 is under vacuum. Chamber cover 116 covers chamber 100 and seals chamber 100 during wafer processing.

During pre-clean processing, RF power is supplied to chamber 100. Gas inlet 114 introduces argon gas or other appropriate gases into the chamber for the pre-clean etching. RF power is then supplied to chamber 100, causing high voltage and high current to strike an argon plasma in the chamber. When the RF power is supplied to chamber 100, the bottom surface of chamber lid 116 acts as an anode and wafer pedestal 108 acts as a cathode. Positively charged argon ions are attracted to the negatively charged wafer pedestal 108. These ions bombard wafer W on wafer pedestal 108 and vertically etch the wafer surface.

FIGS. 2 and 3 illustrate a typical configuration for gas inlet 114. Gas inlet 114 comprises a gas trench 200 into which argon gas is introduced. Gas trench cover 202 is coupled to gas trench 200 and comprises a plurality of channels 204 that direct the gas introduced into gas trench 200 into focused streams that are introduced into chamber 100. Channels 204 are evenly spaced in gas trench cover 202 to provide even distribution of the gas in chamber 100. Because the channels 204 are vertical, the gas streams produced tend to bombard the chamber cover 116. If any oxide or other particulates have adhered to chamber cover 116 during a previous etch process, the gas streams may dislodge those particulates. The dislodged particulates may subsequently adhere to the surface of the wafer or settle back onto gas trench cover 202 only to be dislodged during a subsequent etch process, thereby compromising film properties of the PVD film to the surface of wafer W during subsequent PVD processing.

FIG. 4 illustrates a typical insulator 110 of the prior art. Insulator 110 is manufactured in one piece from quartz, ceramic or other appropriate insulating material. It is undesirable to have any significant portion of wafer pedestal 108 exposed to the chamber environment, as wafer pedestal 108 may be etched during the etch process, thereby releasing metal particles into the chamber. Consequently, insulator 110 preferably completely insulates the bottom and side surfaces of wafer pedestal 108. A one-piece insulator, however, poses several problems. First, the insulator surfaces are etched away during each etching process, thus exposing wafer pedestal 108 to the plasma. Insulator 110 can only be used for a certain number of etch cycles before its surface is so degraded that it must be replaced. Consequently, because insulator 110 is a relatively expensive component of the system, operational costs are high.

In addition, during the etch process, oxide and other particulates are released from the wafer and can be deposited on the insulator. This poses an additional problem as these particulates can be dislodged from the insulator during later processes and can adhere to the surface of other wafers, thus reducing device performance. Insulator 110 is typically manufactured with a roughened or course surface to absorb such particulates, although particulates can accumulate to such an extent that they can easily be dislodged from insulator 110 during etching. Consequently, it becomes necessary to clean and resurface insulator 110 between uses. However, subsequent cleaning and resurfacing of insulator 110 can create cracks in the insulator, resulting in degradation of the tolerances of the insulator and exposing wafer pedestal 108 and the bottom surface of wafer W to the etch process.

Referring again to FIG. 1, bellows assembly 112 of wafer lift 106 is generally designed in an accordion-like fashion, and is manufactured from a non-reactive metal such as stainless steel. During etching, oxide and other chemical residue particulates which are etched from the wafer tend to settle on chamber walls 104, chamber base 102 and bellows assembly 112. Because chamber walls 104 and base 102 remain stationary and are not subject to gas inlet streams, dislodgment of particulates from these structures during a subsequent etch procedure does not pose a significant problem. However, bellows assembly 112 expands and contracts as shaft 120 moves wafer lift 106 in a vertical direction; such movement may cause dislodgment of particulates deposited from a previous etch processes. Again, such particles can adhere to the surface of the wafer, adversely affecting the film properties of subsequent PVD processing.

Accordingly, there is a need for pre-clean chamber in a semiconductor processing system that minimizes the generation of particulates during processing, and which thereby increases the uniformity of subsequent PVD processes while decreasing operational costs.

SUMMARY OF THE INVENTION

The present invention concerns an improved pre-clean chamber of a semiconductor processing system that minimizes the generation of particulates during processing, thereby increasing the uniformity of a subsequent PVD process while decreasing operational costs. The improved pre-clean chamber comprises a base, a chamber wall, and a chamber cover. A gas suitable for etching a semiconductor wafer is introduced into the chamber via a gas inlet trench. A gas trench cover directs the gas from the gas inlet trench into streams that are focused up and towards the center of the chamber to reduce the extent to which the gas bombards the chamber cover dislodging particulates that may have adhered to the cover during a previous etch process.

In accordance with a preferred embodiment of the present invention, the improved pre-clean chamber also includes a wafer lift that supports the wafer in the pre-clean chamber and moves it vertically from a release position to a processing position. The wafer lift suitably comprises a wafer pedestal, an insulator, an insulator collar, an insulator base, a shaft, a bellows and a bellows cover. The wafer pedestal maybe manufactured from aluminum, titanium or other non-reactive metal and is RF-biased. The insulator, manufactured from ceramic or other non-reactive, insulating material, supports the wafer pedestal and insulates the bottom surface of the wafer pedestal.

In accordance with a further aspect of the present invention, the insulator collar may be manufactured from quartz, ceramic or other insulating material and may be a disposable item. The collar is supported by the insulator and, when coupled with the insulator, insulates the outside diameter surface of the wafer pedestal, thereby mitigating etching of the wafer pedestal during the etch process. Because the insulator collar can be discarded after an etch process, it does not have to be cleaned or resurfaced. Further, because it is not subjected to multiple etch processes, its surfaces are not degraded.

The shaft supports the wafer pedestal, insulator collar, insulator and insulator base. Annular bellows surround the shaft and isolate the shaft when the chamber is subjected to a vacuum. The bellows expand and contract as the shaft moves to raise and lower a wafer supported by the wafer pedestal. A bellows cover is fixedly attached to the insulator base to prevent particulates from adhering to the bellows during an etch process and dislodging from the bellows when the shaft raises and lowers the wafer.

These and other aspects, features and advantages of the present invention will be better understood by studying the detailed description in conjunction with the drawings and the accompanying claims.

BRIEF DESCRIPTION OF THE DRAWINGS

A detailed description of embodiments of the invention will be made with reference to the accompanying drawings, wherein like numerals designate corresponding parts in the several Figures, and wherein.

DETAILED DESCRIPTION OF THE INVENTION

Figure 1:
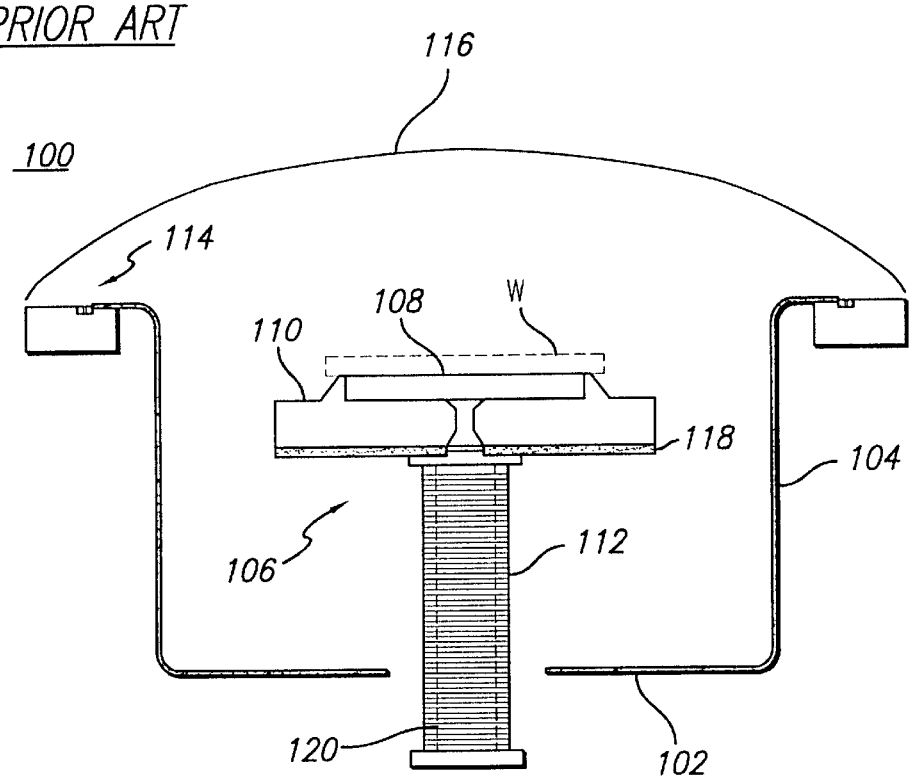
FIG. 1 illustrates a pre-clean chamber available in the prior art.
Figure 5:
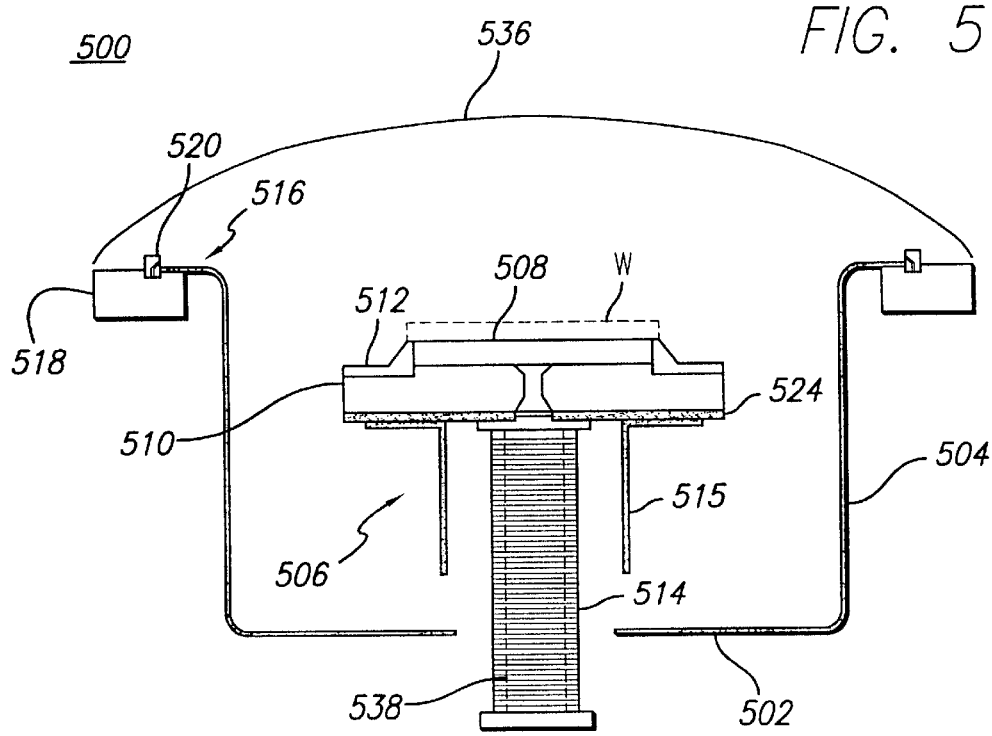
FIG. 5 illustrates an embodiment of a pre-clean chamber in accordance with the present invention.
Figure 2:
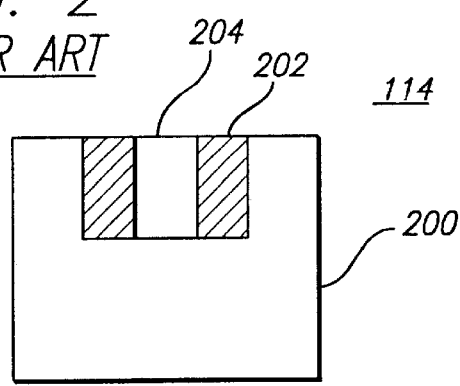
FIG. 2 is a cross-sectional view of a gas inlet available in the prior art.
Figure 3:
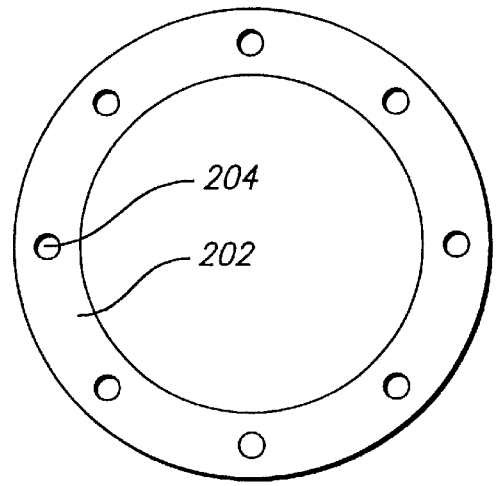
FIG. 3 is a plan view of a gas inlet cover available in the prior art.
Figure 4:
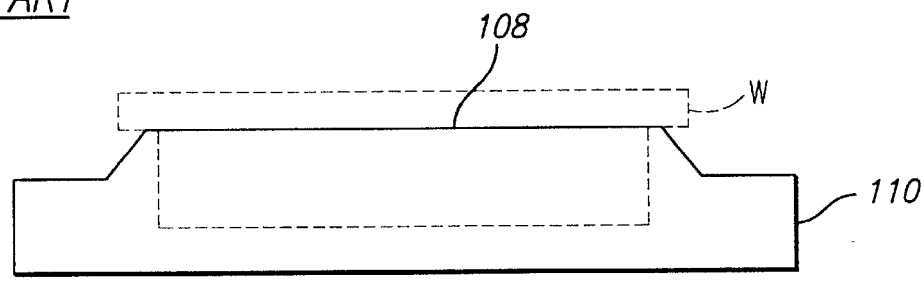
FIG. 4 is a side view of an insulator available in the prior art.

Referring now to FIG. 5, an exemplary embodiment of the present invention suitably comprises a pre-clean chamber, chamber 500, including a chamber base 502, a chamber wall 504 that includes a wafer port (not shown) for receiving a wafer W, and a chamber cover 536. Once introduced to chamber 500 from the transport chamber (not shown) under vacuum, wafer W is transferred to a wafer lift 506. Wafer lift 506 is comprised of a wafer pedestal 508, an insulator 510, an insulator collar 512, an insulator base 524, a shaft 538, and a bellows assembly 514. Wafer W is seated upon wafer pedestal 508 which suitably comprises an RF-biased, aluminum, titanium or other non-reactive metal disk-shaped platform. Wafer pedestal 508 is supported by insulator 510 which also serves to insulate the bottom surface of wafer pedestal 508. Insulator 510 preferably comprises alumina or other ceramic material; alternatively, insulator 510 may be manufactured from quartz or other non-reactive insulative material. Insulator 510 is supported by insulator base 524. Annular insulator collar 512 is supported by insulator 510 and, when coupled with insulator 510, is configured to insulate the outside diameter surface of wafer pedestal 508 during etching.

Shaft 538 supports wafer pedestal 508, insulator 510, insulator collar 512 and insulator base 524 and moves wafer W in a vertical direction between a release position, where wafer W is introduced from and is removed to the transport chamber, and a processing position, where wafer W is maintained during the etching process. Bellows 514 is manufactured from stainless steel or other non-reactive metal in an accordion-like fashion and annularly surrounds shaft 538 to isolate shaft 538 when chamber 500 is under vacuum.

During processing, wafer W is introduced into chamber 500 and is placed on wafer pedestal 508 which is located in the chamber at a release position. Wafer pedestal 508 is then raised by shaft 538 to a processing position. Argon gas or other suitable etching gas is introduced into chamber 500 through gas inlet 516. RF power is then supplied to chamber 500, causing high voltage and high current to yield an argon plasma in the chamber. When the RF power is supplied to chamber 500, the bottom surface of chamber cover 536 acts on an anode and wafer pedestal 508 acts as a cathode. Positively charged argon ions are attracted to the negatively charged wafer pedestal 508. These ions bombard wafer W on wafer pedestal 508 and vertically etch the wafer surface.

Figure 6:
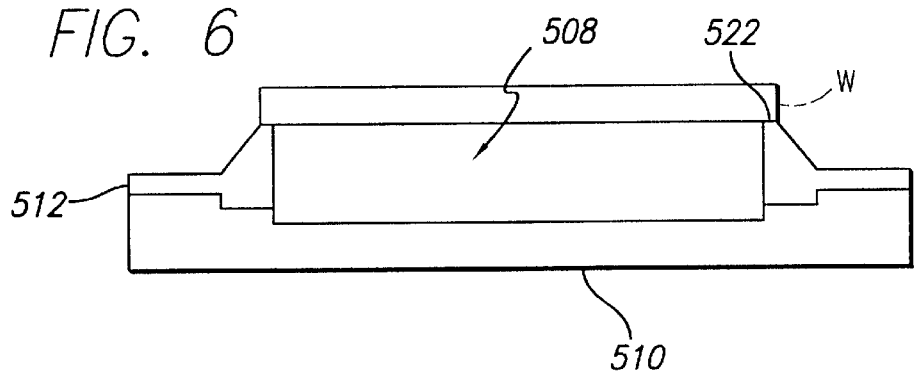
FIG. 6 is a cross-sectional view of an insulator collar of the present invention.

FIG. 6 illustrates a cross-sectional view of insulator 510, insulator collar 512, wafer pedestal 508 and a wafer W. During processing, wafer W is supported by wafer pedestal 508 and insulator collar 512. It is undesirable to have any portion of wafer pedestal 508 exposed to the plasma during processing, as metal particles may be dislodged from wafer pedestal 508 and absorbed by wafer W. Consequently, the diameter of wafer pedestal 508 is preferably smaller than the diameter of wafer W so that the top surface of wafer pedestal is completely covered by wafer W during processing. To reduce the possibility of etching the underside of wafer W, the top surface 522 of insulator collar 512 is of a width sufficient to prevent any significant portion of the lower surface of wafer W from being exposed to the ambient environment. In a preferred embodiment, insulator collar 512 completely surrounds wafer pedestal 508 and the height of the inside diameter surface of insulator collar 512 is sufficient to ensure that, when it is coupled with insulator 510, no significant portion of the outside diameter surface of wafer pedestal 508 is exposed to the ambient environment of chamber 500. Further, insulator collar 512, when coupled with insulator 510, serves to collimate the RF power to the top surface of wafer pedestal 508.

Insulator collar 512 can be manufactured from quartz, ceramic alumina, or any other appropriate non-reactive insulating material. Insulator collar 512 is typically a one-time usage item that can be discarded after processing and thus provides a number of advantages over the prior art. First, because insulator collar 512 is a disposable item, cleaning and resurfacing insulator collar 512 between etch processes is not necessary, thereby reducing operational down-time and expense. In addition, because insulator collar 512 is not exposed to multiple etch processes, and because it is not subjected to cleaning and resurfacing, the integrity of insulator collar 512 remains substantially intact resulting in consistent etching during each subsequent process. Further, because insulator collar 512 is smaller than the insulator of the prior art, it is easier to manufacture with more accurate tolerances.

Figure 7A:
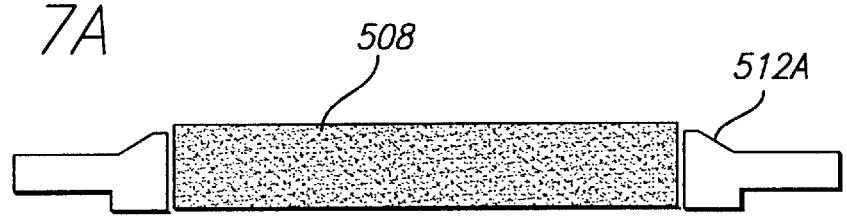
FIG. 7A–7D illustrates various embodiments of the insulator collar of the present invention.
Figure 7B:
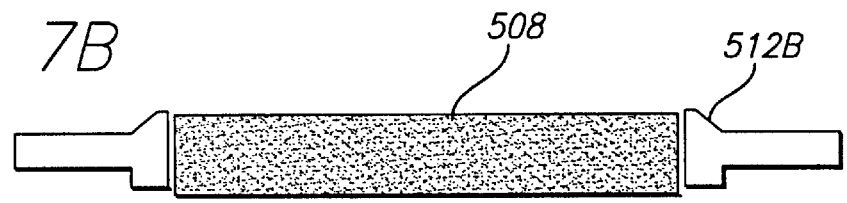

FIGS. 7A through 7D illustrate various design embodiments of insulator collar 512 in accordance with the present invention. FIG. 7A illustrates one embodiment of the invention, that is, an insulator collar 508A in which the height of the inside diameter surface of insulator collar 508A is such that, when insulator 508A is coupled with insulator 510, an insignificant portion of wafer pedestal 508 is exposed to the ambient environment in chamber 500. It is desirable, however, to minimally expose the surfaces of wafer pedestal 508 to mitigate dislodgment of metal particles from wafer pedestal 508A during etching. In accordance with the preferred embodiment of present invention shown in FIG. 7B, the height of the inside diameter surface of insulator collar 512B is such that, when coupled with insulator 510, wafer pedestal 508 is not exposed to the ambient environment of the chamber during etching.

Figure 7C:
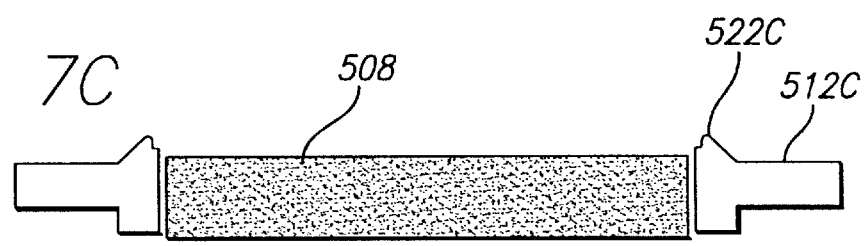
Figure 7D:
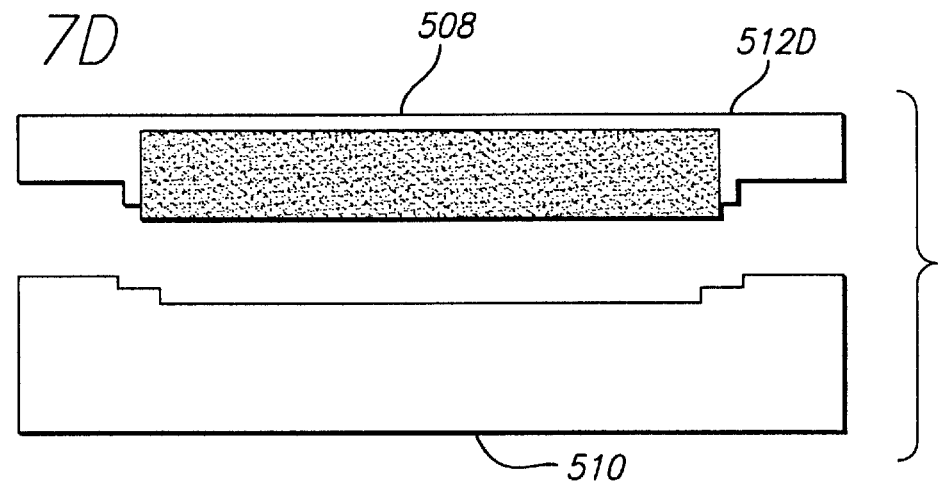

FIG. 7C illustrates another embodiment of the present invention in which the height of the inside diameter surface of insulator collar 512C is such that, when coupled with insulator 510, the inside diameter surface of insulator collar 512C extends vertically upward beyond the outside diameter side surface of wafer pedestal 508. Thus, wafer W is essentially supported by the top surface 522C of insulator collar 512C. FIG. 7D illustrates another embodiment of the present invention in which insulator collar 512, when coupled with insulator 510, essentially isolates the top surface and outside diameter surface of wafer pedestal 508. Thus, wafer W is supported by insulator collar 512D.

Figure 8:
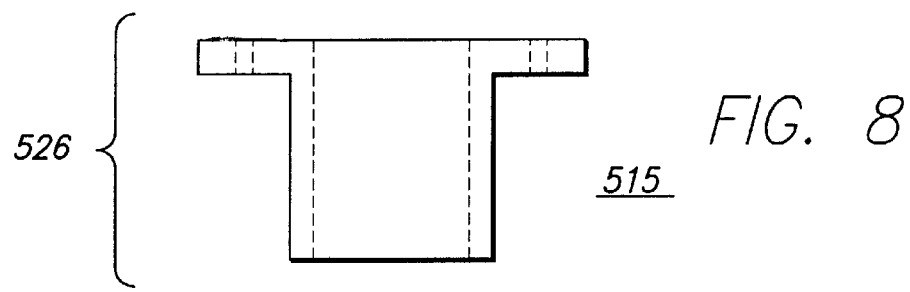
FIG. 8 is a side view of a bellows cover of the present invention.
Figure 9:
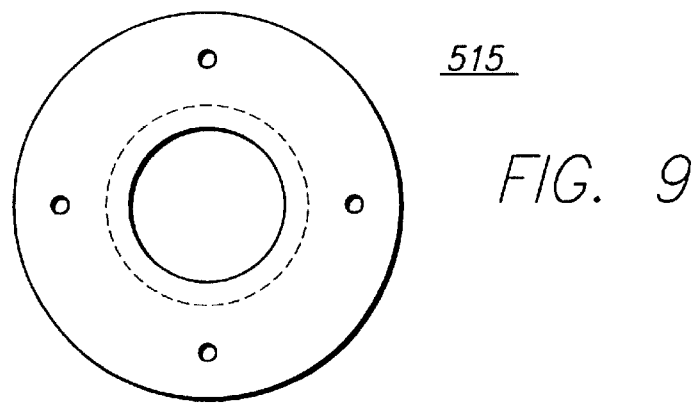
FIG. 9 is plan view of a bellows cover of the present invention.

FIG. 5 also illustrates another aspect of the present invention, that is, an annular bellows cover 515 which shields bellows 514 from particulate adhesion during etching, thereby reducing undesirable particulates from being dislodged from bellows 514 during processing. In a preferred embodiment, bellows cover 515 is fixedly attached to insulator base 524. Alternatively, bellows cover 515 may be fixedly attached directly to insulator 510. Bellows cover 515 is manufactured from an inert metal, such as aluminum, and completely circumferencially surrounds bellows 514. Bellows cover 515 may be manufactured as one single unit or can be manufactured as two or more parts such that, when joined together and attached to insulator base 524 or insulator 510, it circumferencially surrounds bellows 514. FIG. 8 illustrates a side view and FIG. 9 illustrates a top view of a one-unit bellows cover 515. The total height 526 of bellows cover 515 is preferably sufficient to shield the maximum surface area of bellows 514 without impacting base 502 when wafer lift 506 is lowered to the release position.

Figure 10:
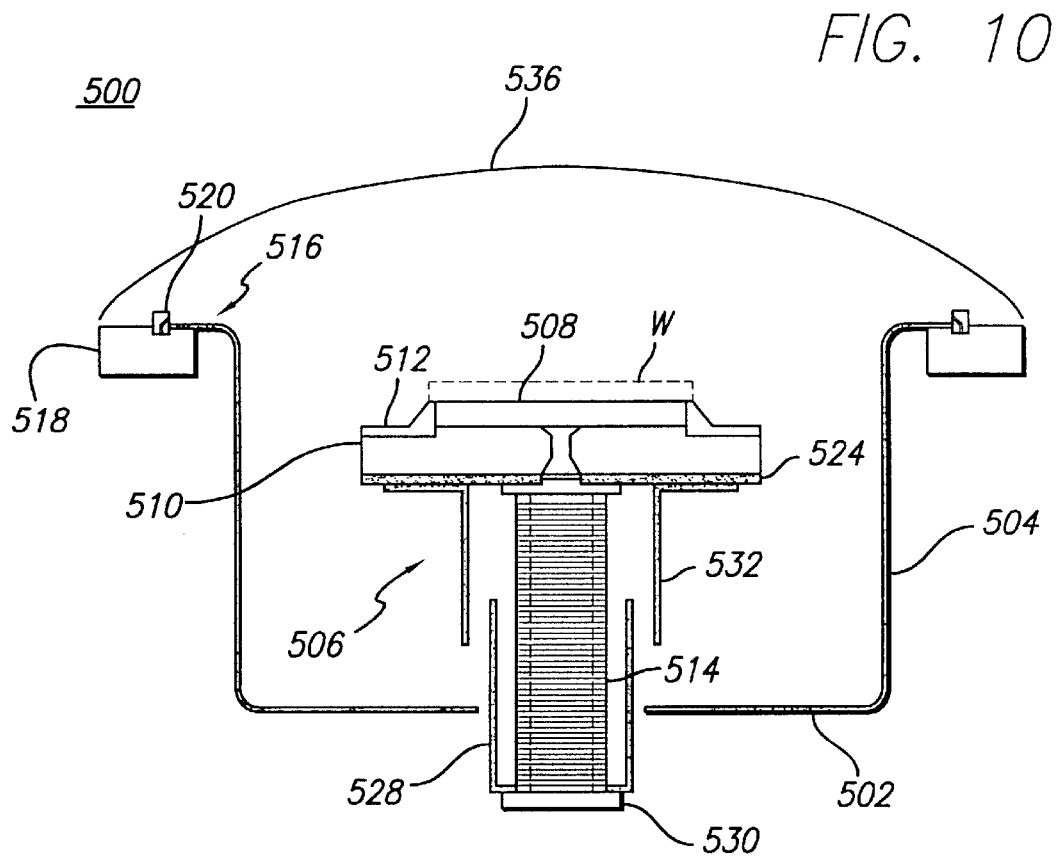
FIG. 10 illustrates an alternative embodiment of a pre-clean chamber in accordance with the present invention.

FIG. 10 illustrates an alternative embodiment of the invention wherein bellows 514 is circumferentially surrounded by a pair of annular bellow covers comprising upper bellows cover 532 and lower bellows cover 528. The diameter of respective bellows covers 532 and 528 are suitably configured such that they do not interfere with each other upon vertical movement of wafer lift 506. Upper bellows cover 532 is fixedly attached to insulator base 524. Alternatively, upper bellows cover 532 is fixedly attached to insulator 510. Upper bellows cover 532 extends vertically downward from insulator base 524 or insulator 510 to protect the upper portion of bellows 514 from particulate adhesion during etching. Preferably, lower bellows cover 528 is fixedly attached to base 530 that supports bellows 514 and extends vertically upward to protect the lower portion of bellows 514 from particulate adhesion during etching. One skilled in the art will appreciate that, in an alternative embodiment of the present invention, chamber 500 could comprise only lower bellows cover 528 without upper bellows cover 515. The height of lower bellows cover 528 is preferably sufficient to cover the maximum amount of the surface area of bellows 514 without interfering with insulator base 524 (or, alternatively, insulator 510) upon lowering of wafer lift 506 to release position.

Figure 11:
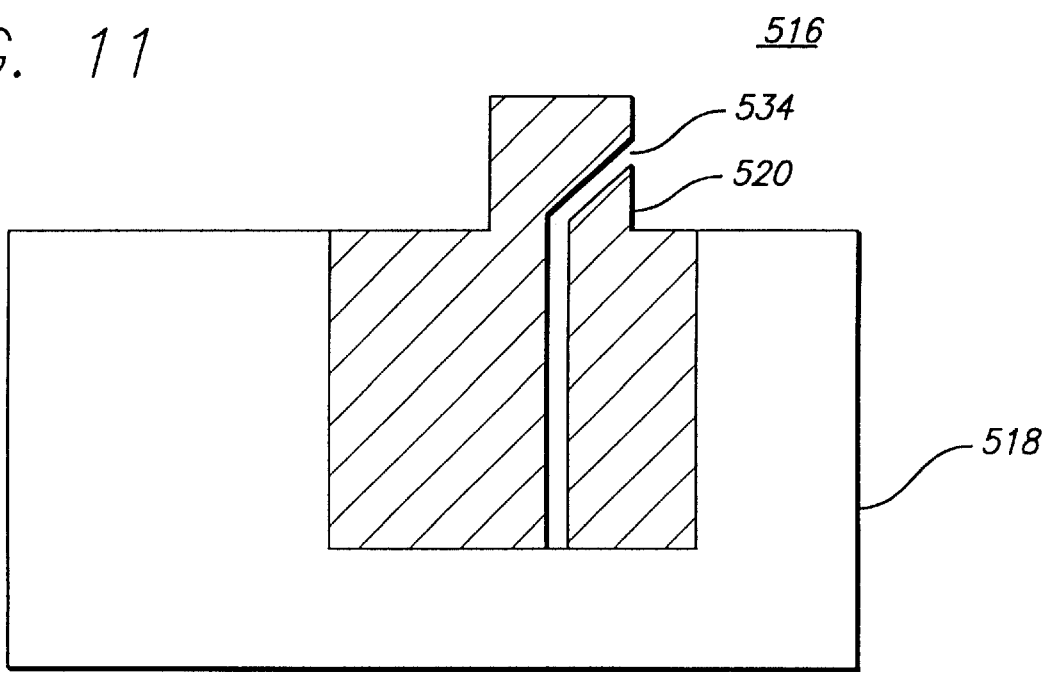
FIG. 11 is a cross-sectional view of a gas trench cover in accordance with the present invention.

A further aspect of the present invention is illustrated in FIGS. 5 and 11. Improved gas inlet 516 comprises gas trench 518 into which argon gas is introduced. Gas trench cover 520 is coupled to gas trench 518 and comprises a plurality of channels 534 which produce and direct gas streams from gas trench 518 vertically upwards and towards the center of gas chamber 500. Gas inlet cover 520 prevents the gas streams from directly bombarding chamber cover 536 and dislodging particulates that adhered to chamber lid 536 during prior etch processing.

While the present invention has been described with reference to specific preferred embodiments thereof, it will be understood by those skilled in this art that various changes may be made without departing from the true spirit and scope of the invention. In addition, many modifications

What is claim is:

1. A pre-clean chamber for receiving a gas for etching a semiconductor wafer wherein said pre-clean chamber has a chamber wall and a chamber cover and further comprises:
   a wafer pedestal for supporting said wafer during etching wherein said wafer pedestal has a bottom surface and an outside diameter surface;
   an insulator mounted adjacent to said wafer pedestal for insulating said bottom surface of said wafer pedestal during etching of said wafer; and
   an insulator collar removably coupled to said insulator and annularly disposed around said outside diameter surface of said wafer pedestal, wherein said insulator collar insulates at least a portion of said outside diameter surface of said wafer pedestal during etching of said wafer, and wherein said insulator collar comprises a single disposable piece.

2. The pre-clean chamber of claim 1 further comprising a gas inlet disposed adjacent to said chamber wall for directing said gas towards the center of said pre-clean chamber so as to prevent dislodgment of particulates from said chamber cover or said, chamber wall.

3. The pre-clean chamber of claim 2 wherein said gas inlet comprises a gas inlet conduit for receiving said gas and a gas inlet cover coupled to said gas inlet conduit and having a plurality of channels for directing said gas towards the center of said pre-clean chamber.

4. The pre-clean chamber of claim 2 further comprising:
   a shaft vertically disposed within said pre-clean chamber for translating said wafer pedestal from a first position for receiving said wafer and a second position for etching of said wafer;
   a bellows annularly disposed around said shaft; and
   a bellows cover annularly disposed around said bellows.

5. The pre-clean chamber of claim 1 further comprising:
   a shaft vertically disposed within said pre-clean chamber for translating said wafer pedestal between a first position for receiving said wafer and a second position for etching of said wafer;
   a bellows annularly disposed around said shaft; and
   a bellows cover annularly disposed around said bellows.

6. The pre-clean chamber of claim 1 wherein said insulator is comprised of a ceramic material.

7. The pre-clean chamber of claim 1 wherein said insulator collar is comprised of quartz.

8. A wafer processing apparatus having a transfer chamber and a plurality of peripheral chambers positioned around the periphery of said transfer chamber, the improvement which comprises:
   a pre-clean chamber for receiving a gas for etching a semiconductor wafer, said pre-clean chamber having a chamber wall and a chamber cover, and further comprising:
   a wafer pedestal for supporting said wafer during etching wherein said wafer pedestal has a bottom surface and an outside diameter surface;
   an insulator mounted adjacent to said wafer pedestal for insulating said bottom surface of said wafer pedestal during etching of said wafer; and
   an insulator collar removably coupled to said insulator and annularly disposed around said outside diameter surface of said wafer pedestal, wherein said insulator collar insulates at least a portion of said outside diameter surface of said wafer pedestal during etching of said wafer, and wherein said insulator collar comprises a single disposable piece.

9. The wafer processing apparatus of claim 8 wherein said pre-clean chamber further comprises a gas inlet disposed adjacent to said chamber wall for directing said gas towards the center of said pre-clean chamber so as to prevent dislodgment of particulates from said chamber cover or said chamber wall.

10. The wafer processing apparatus of claim 9 wherein said gas inlet comprises a gas inlet conduit for receiving said gas and a gas inlet cover coupled to said gas inlet conduit and having a plurality of channels for directing ;aid gas towards the center of said pre-clean chamber.

11. The wafer processing apparatus of claim 9 further comprising:
    a shaft vertically disposed for translating said wafer pedestal between a first position for receiving said wafer within said pre-clean chamber and a second position for etching of said wafer within said pre-clean chamber;
    a bellows annularly disposed around said shaft; and
    a bellows cover annularly disposed around said bellows.

12. The wafer processing apparatus of claim 9 wherein said insulator is comprised of a ceramic material.

13. The wafer processing apparatus of claim 9 wherein said insulator collar is comprised of quartz.

14. The wafer processing apparatus of claim 8 further comprising:
    a shaft vertically disposed within said pre-clean chamber for translating said wafer pedestal between a first position for receiving said wafer and a second position for etching of said wafer;
    a bellows annularly disposed around said shaft; and
    a bellows cover annularly disposed around said bellows.

15. The wafer processing apparatus of claim 8 wherein said insulator is comprised of a ceramic material.

16. The wafer processing apparatus of claim 8 wherein said insulator collar is comprised of quartz.

17. A pre-clean chamber for receiving a gas for etching a semiconductor wafer wherein said pre-clean chamber has a chamber wall and a chamber cover and further comprises:
    a wafer pedestal for supporting said wafer during etching, wherein said wafer pedestal has a bottom surface and an outside diameter surface;
    an insulator mounted adjacent to said wafer pedestal for insulating said bottom surface of said wafer pedestal during etching of said wafer;
    an insulator collar removably coupled to said insulator and annularly disposed around said outside diameter surface of said wafer pedestal, wherein said insulator collar insulates at least a portion of said wafer pedestal during etching of said wafer;
    a gas inlet disposed adjacent to said chamber wall for directing gas towards the center of said pre-clean chamber so as to prevent dislodgment of particulates from said chamber cover or said chamber wall;
    a shaft vertically disposed within said pre-clean chamber for translating said wafer pedestal between a first position for receiving said wafer and a second position for etching of said wafer;
    a bellows annularly disposed around said shaft; and
    a bellows cover annularly disposed around said bellows.

18. The pre-clean chamber of claim 17 wherein said gas inlet comprises a gas inlet conduit for receiving said gas and a gas inlet cover coupled to said gas inlet conduit and having a plurality of channels for directing said gas towards the center of said pre-clean chamber.

19. The pre-clean chamber of claim 17 where in said insulator is comprised of a ceramic material.

20. The pre-clean chamber of claim 17 wherein said insulator is comprised of quartz.

21. A wafer support apparatus for supporting a semiconductor wafer during plasma etching comprising:
   a wafer pedestal for supporting said wafer during etching, wherein said wafer pedestal has a bottom surface and an outside diameter;
   an insulator mounted adjacent to said wafer pedestal for insulating said bottom surface of said wafer pedestal during etching of said wafer; and
   an insulator collar removably coupled to said insulator and annularly disposed around said outside diameter surface of said wafer pedestal, wherein said insulator collar insulates at least a portion of said outside diameter surface of said wafer pedestal during etching of said wafer, and wherein said insulator collar comprises a single disposable piece.

22. The wafer support apparatus of claim 21 further comprising:
   a shaft vertically disposed for translating said wafer pedestal between a first position for receiving said wafer and a second position for etching of said wafer;
   a bellows annularly disposed around said shaft; and
   a bellows cover annularly disposed around said bellows.

23. The wafer support apparatus of claim 22 wherein said insulator is comprised of a ceramic material.

24. The wafer support apparatus of claim 22 wherein said insulator collar is comprised of quartz.

25. The wafer support apparatus of claim 21 wherein said insulator is comprised of a ceramic material.

26. The wafer support apparatus of claim 21 wherein said insulator collar is comprised of quartz.

27. A pre-clean chamber for receiving a gas for etching a semiconductor wafer wherein said pre-clean chamber has a chamber wall and a chamber cover and further comprises:
   a wafer pedestal for supporting said wafer during etching wherein said wafer pedestal has a bottom surface and an outside diameter surface;
   an insulator mounted adjacent to said wafer pedestal for insulating said bottom surface of said wafer pedestal during etching of said wafer;
   an insulator collar removably coupled to said insulator and annularly disposed around said outside diameter surface of said wafer pedestal, wherein said insulator collar insulates at least a portion of said outside diameter surface of said wafer pedestal during etching of said wafer;
   a shaft vertically disposed within said pre-clean chamber for translating said wafer pedestal between a first position for receiving said wafer and a second position for etching of said wafer;
   a bellows annularly disposed around said shaft; and
   a bellows cover annularly disposed around said bellows.

28. The pre-clean chamber of claim 27 further comprising a gas inlet disposed adjacent to said chamber wall for directing said gas towards the center of said pre-clean chamber so as to prevent dislodgment of particulates from said chamber cover or said chamber wall.

29. A wafer processing apparatus having a transfer chamber and a plurality of peripheral chambers positioned around the periphery of said transfer chamber, the improvement which comprises:
   a pre-clean chamber for receiving a gas for etching a semiconductor wafer, said pre-clean chamber having a chamber wall and a chamber cover, and further comprising:
   a wafer pedestal for supporting said wafer during etching wherein said wafer pedestal has a bottom surface and an outside diameter surface;
   an insulator mounted adjacent to said wafer pedestal for insulating said bottom surface of said wafer pedestal during etching of said wafer;
   an insulator collar removably coupled to said insulator and annularly disposed around said outside diameter surface of said wafer pedestal, wherein said insulator collar insulates at least a portion of said outside diameter surface of said wafer pedestal during etching of said wafer;
   a shaft vertically disposed within said pre-clean chamber for translating said wafer pedestal between a first position for receiving said wafer and a second position for etching of said wafer;
   a bellows annularly disposed around said shaft; and
   a bellows cover annularly disposed around said bellows.

30. The pre-clean chamber of claim 29 further comprising a gas inlet disposed adjacent to said chamber wall for directing said gas towards the center of said pre-clean chamber so as to prevent dislodgment of particulates from said chamber cover or said chamber wall.

31. A wafer support apparatus for supporting a semiconductor wafer during plasma etching comprising:
   a wafer pedestal for supporting said wafer during etching, wherein said wafer pedestal has a bottom surface and an outside diameter;
   an insulator mounted adjacent to said wafer pedestal for insulating said bottom surface of said wafer pedestal during etching of said wafer;
   an insulator collar removably coupled to said insulator and annularly disposed around said outside diameter surface of said wafer pedestal, wherein said insulator collar insulates at least a portion of said outside diameter surface of said wafer pedestal during etching of said wafer;
   a shaft vertically disposed for translating said wafer pedestal between a first position for receiving said wafer and a second position for etching of said wafer;
   a bellows annularly disposed around said shaft; and
   a bellows cover annularly disposed around said bellows.

* * * * *